United States Patent
Blaesing-Bangert et al.

(10) Patent No.: US 6,778,260 B2
(45) Date of Patent: Aug. 17, 2004

(54) COORDINATE MEASURING STAGE AND COORDINATE MEASURING INSTRUMENT

(75) Inventors: Carola Blaesing-Bangert, Huettenberg (DE); Ulrich Kaczynski, Bad Nauheim (DE)

(73) Assignee: Leica Microsystems Semiconductor GmbH, Wetzlar (DE)

( * ) Notice: Subject to any disclaimer, the term of this patent is extended or adjusted under 35 U.S.C. 154(b) by 0 days.

(21) Appl. No.: 10/224,236

(22) Filed: Aug. 20, 2002

(65) Prior Publication Data

US 2003/0053037 A1 Mar. 20, 2003

(30) Foreign Application Priority Data

Aug. 22, 2001 (DE) .......................... 101 40 174

(51) Int. Cl.$^7$ ......................... G03B 27/42; G03B 27/58; G03B 27/62
(52) U.S. Cl. ............................ 355/72; 355/53; 355/75
(58) Field of Search ................. 355/53, 72, 75

(56) References Cited

U.S. PATENT DOCUMENTS

| | | | |
|---|---|---|---|
| 3,563,186 A | 2/1971 | Piper et al. | 108/143 |
| 4,676,649 A | 6/1987 | Phillips | 356/401 |
| 4,993,696 A * | 2/1991 | Furukawa et al. | 269/73 |
| 5,204,712 A * | 4/1993 | Bouwer et al. | 355/53 |
| 5,249,343 A * | 10/1993 | Grosso et al. | 29/281.4 |
| 5,260,622 A * | 11/1993 | West | 310/328 |
| 5,574,556 A | 11/1996 | Mori et al. | 356/244 |
| 5,835,198 A * | 11/1998 | Covello et al. | 355/72 |
| 6,255,796 B1 | 7/2001 | Ebihara et al. | 318/649 |
| 6,347,458 B1 | 2/2002 | Kaczynski | 33/503 |
| 6,606,146 B2 * | 8/2003 | Saiki | 355/72 |

FOREIGN PATENT DOCUMENTS

| | | |
|---|---|---|
| DE | 4021949 | 8/1995 |
| DE | 19828815 | 12/1999 |
| EP | 1014030 | 6/2000 |

OTHER PUBLICATIONS

Roeth et al. '*Maskenmetrologie mit der LEICA LMS IPRO fuer die Halbleiter–Produktion*' In Mitteilungen fuer Wissenschaft und Technik; vol. XI, No. 5 pp. 130–135; Oct. 1997 (see specification text page 1).

* cited by examiner

Primary Examiner—Rodney Fuller
(74) Attorney, Agent, or Firm—Davidson, Davidson & Kappel, LLC (57) ABSTRACT

A coordinate measuring stage includes a stationary base part having a linear X guidance element, a center part slidable along the linear X guidance element, and an X-Y-positionable stage body for reception of a substrate, the X-Y positionable stage body being movable slidingly alone the Y guidance element. The center part is arranged in freely suspended fashion over the base part and supported at one end on the Y guidance element and with at another end on another support element. The Y guidance element, the other support element, and the stake body are supported, slidably and independently of one another, on the surface of the base part.

18 Claims, 5 Drawing Sheets

Fig. 5

COORDINATE MEASURING STAGE AND COORDINATE MEASURING INSTRUMENT

CROSS REFERENCE TO RELATED APPLICATIONS

This application claims priority of the German patent application 101 40 174.4 which is incorporated by reference herein.

FIELD OF THE INVENTION

The invention concerns a coordinate measuring stage with interferometric position determination, as well as a coordinate measuring instrument for high-accuracy measurement of the coordinates of the edges of a pattern element on a substrate

BACKGROUND OF THE INVENTION

Coordinate measuring stages of the kind cited above are used in high-accuracy coordinate measuring instruments of the kind cited above. One such coordinate measuring instrument is described in the article "Maskenmetrologie mit der LEICA LMS IPRO für die Halbleiterproduktion" [Mask metrology using the LEICA LMS IPRO for semiconductor production] by K. -D. Röth and K. Rinn, Mitteilungen für Wissenschaft und Technik Vol. XI, No. 5, pp. 130–135, October 1997. This measuring instrument is used for high-accuracy measurement of the coordinates of the edges of a pattern element on a substrate, e.g. a mask and a wafer.

The coordinate measuring instrument comprises a measuring stage of the kind cited above which is horizontally displaceable in the X direction and the Y direction. It serves to receive the substrates having features whose edge coordinates are to be measured. In addition, a separate interferometer measurement beam path is associated with each coordinate axis (X, Y) of the measuring stage. Mounted on two mutually perpendicular sides of the measuring stage are measurement mirrors that are located at the ends of the two interferometer measurement beam paths. By means of the two measurement mirrors, the position of the measuring stage can be determined interferometrically.

The coordinate measuring instrument furthermore possesses an incident-light illumination device having an optical axis; an imaging device (for example, a microscope objective); and a detector device (for example, a high-resolution digital camera or a position-sensitive detector) for the imaged features. The measured coordinates of an edge of a feature to be measured are obtained from the interferometrically measured present position of the measuring stage and the distance (relative to the optical axis) of the feature to be measured. The positioning accuracy with which the interferometric measurement of the measuring stage position is acquired therefore directly influences the determination of the coordinates of the edges on the features on the substrates. Because an optimum measurement result requires that optical sensing occur in an accurately defined focal plane (called the Abbéplane), deviations in vertical running accuracy from that ideal plane also contribute error components to the measurement results.

Coordinate measuring instruments of the aforesaid kind serve for the determination of coordinates with a reproducibility in the range of less than 5 nm. Since this measurement accuracy depends very substantially on the X-Y positioning accuracy and the vertical running accuracy of the measuring stage, the requirements in terms of the construction of the measuring stage are extremely high.

A coordinate measuring stage of the coordinate measuring instrument described above comprises the following elements arranged one above another:

a stationary base part having a linear X guidance element;

above that, a center part, movable slidingly along the linear X guidance element, which has a first drive element associated with it and is rigidly joined to a linear Y guidance element;

above that, an X-Y-positionable stage body which is movable slidingly along the Y guidance element and has a second drive element associated with it.

The X guidance element is configured on the center of the base part, for example as a recessed groove on which the center part is guided. The wide center part is arranged transversely to the X guidance element and forms, with the X guidance element, a movable cross. This stage construction is therefore commonly known to those skilled in the art as a "cross-slide stage." The center part carries the Y guidance element on its center axis, and is supported on the surface of the base part, on either side of the X guidance element, with a total of three support air bearings. The result is a stable three-point support.

The stage body is guided in its motion by the Y guidance element, and spans over the center part. It is supported on the surface of the base part, on either side of the X guidance element, with a total of four support air bearings, i.e. with two support air bearings on each side of the X guidance element. Since a bearing system having four support surfaces is redundant, one of the four support air bearings is configured as a resilient support air bearing in order to compensate for irregularities on the surface of the base part.

Since the coordinate measuring machine must be operated at a constant ambient temperature in order to achieve optimum measurement results, it is set up in a climate-controlled chamber. In individual factories, different ambient temperatures are required in the climate-controlled chambers. The instruments are thus operated, depending on the temperature selected, in a temperature range between 20 and 23° Celsius. These temperature differences result in different material elongations at the individual components of the coordinate measuring machine. This in turn changes the air gaps of the air bearings. Some of the guidance air bearings were therefore also designed to be resilient. For example, on each guidance element the guidance air bearings on one side of the guidance element are designed to be resilient, and the guidance air bearings on the opposite side are designed to be rigid.

Both the support air bearings and the guidance air bearings were selected with very small air gaps (on the order of 3 to 4 µm). Adaptation to irregularities of the particular guidance surface is performed by way of the respective resiliently mounted support or guidance air bearings. The narrow air gap heights are highly tolerance-sensitive and must therefore be aligned.

The resilient air bearings have proven to be problematic in practice, however, since they permit a slight tilting and therefore warping of the stage body upon displacement of the measurement stage and with different substrate weights. In addition, they can transfer the vertical orientation inaccuracies of the center part, caused by the irregularity of the base part surface, via the Y guidance element to the stage body. This results in a change in the interferometric position measurement as a function of the X-Y position that is arrived at, and thus has direct repercussions on measurement accuracy.

A further disadvantage of this measurement stage is the fact that transmitted-light illumination of the substrate is not possible, since the center part extends, with the Y-guide, in the center of the stage. The known measurement stage is also suitable only for substrates up to a maximum size of 220 mm. Any enlargement of the individual elements of the measurement stage for the purpose of adaptation to larger substrates would simply aggravate the vibration problem.

SUMMARY OF THE INVENTION

It is therefore an object of the present invention to describe a coordinate measuring stage that is suitable for both incident-light and transmitted-light measurements, that is suitable for future even larger and heavier substrates (with diameters of 300 mm and more) and at the same time exhibits greatly improved X-Y running accuracy and improved vertical running accuracy.

This object is achieved by a coordinate measuring stage with interferometric position determination that comprises:

a) a stationary base part having a linear X guidance element;

b) a center part placed above said stationary base part, wherein said center part is movable slidingly along the linear X guidance element, which has a first drive element associated with it and is rigidly joined to a linear Y guidance element;

c) an X-Y-positionable stage body placed above said center part, wherein said X-Y-positionable stage body, which is assigned for reception of a substrate, is movable slidingly along the Y guidance element and has a second drive element associated with it;

d) said center part is arranged in freely suspended fashion over said base part, being supported with its one end on said Y guidance element and with its other end on an additionally arranged support element;

e) said Y guidance element, said support element, and said stage body are supported, slidably and independently of one another, on the surface of said base part; and f) said base part, said center part, and said stage body each comprise an internally located opening for a transmitted-light region.

A further object of this invention is to describe a coordinate measuring instrument for high-accuracy measurement of the coordinates of the edges of a pattern element on a substrate that is suitable for both incident-light and transmitted-light measurements, that is suitable for future even larger and heavier substrates (with diameters of 300 mm and more) and at the same time exhibits greatly improved X-Y running accuracy and improved vertical running accuracy.

This object is achieved by a coordinate measuring instrument for high-accuracy measurement of the coordinates of an edge of a pattern element on a substrate, having:

a) an X-Y displaceable coordinate measuring stage with interferometric position determination, which comprises a stationary base part having a linear X guidance element; above that, a center part movable slidingly along the linear X guidance element; and above that, an X-Y-positionable stage body, for reception of the substrate, which is movable slidingly along the Y guidance element;

b) and an illumination device having an optical axis, an imaging device, and a detector device for determining the coordinates of said edge to be measured relative to said optical axis of said illumination device;

c) said center part is arranged in freely suspended fashion over said base part, being supported with its one end on said Y guidance element and with its other end on an additionally arranged support element;

d) said Y guidance element, said support element, and said stage body are supported, slidably and independently of one another, on the surface of said base part; and e) said base part, said center part, and said stage body of said measuring stage each comprise an internally located opening for a transmitted-light region, and said illumination device is provided for incident-light and transmitted-light illumination of the substrate.

To achieve the stated object it was not sufficient to adapt the superimposed elements (base part, center part, and stage body) to the large substrates and merely enlarge them appropriately, since the requisite greatly enlarged displacement range would have made the measuring stage very large and heavy and merely aggravated the vibration problems. That would firstly have created an extremely unstable design and decreased vertical running accuracy. In addition, because of the guide elements required for the X and Y directions, a transmitted-light configuration could not have been realized. A fundamentally different approach to achieving the object thus had to be taken.

The idea of the invention consists substantially in greatly reducing the tolerance chain in the new design. In other words, for example, the sum of the all mechanical tolerances in the Z direction (i.e. the height direction of the stage) had to be decreased. For that purpose, the tolerances in the Z direction for the individual parts connected mechanically to one another had to be calculated during design, taken into account in terms of production engineering, and reduced, so that an extremely good running accuracy for the stage in the X-Y plane was achieved.

Achieving this resulted in a complete change in the mechanical concept of the stage assemblage, departing entirely from the concept of the "cross-slide stage." In the coordinate measuring stage according to the existing art, for example, the center part represented a supporting part and carried the Y guidance element on its longitudinal axis of symmetry. In contrast to this, in the measuring stage according to the present invention the Y guidance element was transformed into the supporting element and the center part into the supported element. This was done by removing the Y guidance element from the axis of the symmetry of the center part and arranging it at the one end of the center part as a supporting part. The other end of the center part was suspended from an additional support element. The center part was thus arranged in suspended fashion, being supported by the Y guidance element and the additionally arranged support element.

This suspended center part also offered for the first time the possibility of achieving a transmitted-light configuration, since the Y guidance element is always arranged far away from the center of the center part and thus outside the center of the measuring stage. The base part, center part, and stage body were therefore equipped with frame-shaped openings in order thereby to create a transmitted-light region.

The Y guidance element and the support element rest with support air bearings on the surface of the base part. The Y guidance element was dimensioned very long, and the support element dimensioned as short as possible. In addition, the center part in the X direction (and thus the spacing between the Y guidance element and the support element) was made as large as possible, so that the air bearings could be arranged at a wide spacing from one another. The result was to achieve a high level of running stability for the measuring stage, with no tendency to tilt. The long center part at the same time offered the ability to make the frame-shaped opening as large as possible in the X direction.

In the coordinate measuring stage of the existing art, a complex tolerance chain for the individual components of the coordinating measuring stage had to be taken into account. For example, the surface flatness values of the stage body, center part, and base part, the dimensional accuracy of the Y guidance element on the center part, the tolerances of the respective support air bearings (flying heights, mounting surface flatness values), and the alignment accuracy of the guidance air bearings, influenced the tolerance calculation. Several tolerances (three or more, as a rule) in terms of shape, position, and dimension had to be complied with for each individual component. Despite that, the air gaps of the guidance air bearings still had to be adjusted individually. Each tolerance-sensitive part also resulted in higher production costs.

Instead of this, in the coordinate measuring stage according to the present invention the reference plane for tolerance calculation is the plane surface of the base part. The stage body is supported slidingly on the base part by means of unsprung support air bearings. Its tolerances are referred to the same reference plane, namely the plane surface of the base part. The individual components of the coordinate measuring stage according to the present invention, for example the center part, stage body, Y guidance element, and Y-guide, need to comply with only one or two tolerances in terms of shape, position, and dimension. For example, only the underside of the stage body, on which the support air bearings are arranged, needs to be configured with accurate flatness. The flatness of the surface of the base part determines the entire vertical running accuracy (deviations from the ideal Z plane) of the coordinate measuring stage according to the present invention.

The air gap spacings of the support air bearings and the guidance air bearings are predefined by the adjacent components, so that the air gaps of the support air bearings and guidance air bearings no longer need to be adjusted, and the structure as a whole is stiffer and therefore less susceptible to vibration than in the case of the known coordinate measuring stage. Running accuracy and positioning accuracy are thus substantially improved with the measuring stage according to the present invention. This in turn improves the measuring accuracy of the coordinate measuring instrument in which the coordinate measuring stage is arranged for reception of the substrate to be measured.

The base part is usually made of granite. For reasons of vibration damping, a large granite block mounted on vibration dampers is used. The Y guidance element and support element, as well as the stage body, are supported via their plane undersides, by means of support air bearings, on the surface of the base part (granite). All the support air bearings are selected to have the same thickness, the absolute thickness tolerance of the support air bearings being on the order of approx. 2 $\mu$m. This is advantageous in terms of bearing maintenance and service, since no alignment work is necessary when replacing a damaged bearing. Since the support air bearings used are all identical, parts count is reduced and individually manufactured bearings are not necessary. All that is necessary for the support air bearings is a sufficient flying height (=air layer).

Resilient mounting was entirely dispensed with in the guidance air bearings as well. The guidance air bearings are independent of thickness tolerance. Only the bolt-on surface and the running surface from which air emerges need to lie exactly in one plane. This was achieved by common lapping of the bolt-on surface and running surface. Alignment of the guidance air bearings is superfluous, since the air gap width is predefined by the adjacent components.

An embodiment of the coordinate measuring stage in which the X guidance system and Y guidance system are of temperature-compensated configuration is particularly advantageous. To achieve this, those components of the coordinate measuring stage on which the guidance bearings for the X guidance element and Y guidance element are mounted are temperature-compensated with respect to the X guidance element and Y guidance element, respectively. This is important because the width of the components of the coordinate measuring stage on which the guidance bearings are mounted determines the spacing of the air bearing installation surfaces that face them, and thus directly influences the width of the guiding air layers that are produced (and hence the guidance properties).

For temperature compensation of the components on which the guidance bearings are mounted, they are selected to be of the same material as the material of the recessed grooves or raised ribs (depending on embodiment) of the X guidance element or Y guidance element at which the guidance air bearings generate guidance with the air gaps that they produce. To ensure additionally that the X and Y guidance systems do not have different expansion characteristics, the two guidance elements (for X and Y) were also selected to be of the same material. Since the base part and thus the X guidance element are made of granite, it followed that the Y guidance element was also made of granite.

The components on which the guidance bearings are mounted were therefore also fabricated from granite. In addition, these components are dimensioned so that they are narrower than the grooves themselves only by an amount equal to the two guiding air layers, or wider than the ribs themselves only by an amount equal to the two guiding air layers.

The result of this is that these components on which the guidance bearings are mounted exhibit exactly the same coefficients of expansion as the grooves or ribs (depending on embodiment) of the X and Y guidance elements. This ensures that even with differences in the ambient temperature of the coordinate measuring stage, the air gaps of the guidance air bearings defined for guidance purposes always remain unchanged. This results in a definite increase in guidance accuracy as compared to previously known guidance system designs.

In an advantageous embodiment of the measuring stage, the vertical running accuracy was improved even further by the fact that the drive elements for the X direction and Y direction were arranged in stationary fashion relative to the base part. For that purpose, energy transfer to the center part movable in the X direction, and to the stage body movable in the Y direction, is effected e.g. by means of at least one push bar in each case, which is connected via a friction coupling to the respective motor. The result of this is that the vertical running accuracy and positioning accuracy of the coordinate measuring stage are constant over the entire displacement range.

This is a distinct advantage over the previously known coordinate measuring stages in which one of the motors was co-moved. In these stages, the weight of the co-moving motor itself resulted, even when the stage body was not loaded, in deformations of the entire measuring stage and thus in a degradation in positioning accuracy as a function of X-Y position. Cable delivery to the motors is also simplified, since the cables no longer need also to be moved; this decreases both wear on the cables and impacts on the coordinate measuring stage. Since the positioning error with the previously known measuring stage was not constant but instead depended on the measurement location and additionally on the weight of the substrate placed on it, the positioning error also could not be eliminated computationally from the measured coordinates of an edge.

The coordinate measuring stage according to the present invention having the stationary drive elements, on the other hand, exhibits a positioning error value that is independent of displacement travel for all attainable X-Y positions and can be accounted for computationally and instrumentally. In addition, the weight that is put in place in each case is kept constant. For that purpose, each substrate that is to be measured in transmitted light is placed in a specifically allocated frame and placed on the stage body together with the frame. For the various substrates, the sum of the weight of the particular substrate and the weight of the associated frame is kept constant. Upon calculation of the coordinates of features to be measured, an error correction can thus be performed for this positioning error value as well.

BRIEF DESCRIPTION OF THE DRAWINGS

The invention is explained below with reference to the schematic drawings, in which.

DETAILED DESCRIPTION OF THE INVENTION

Figure 1:
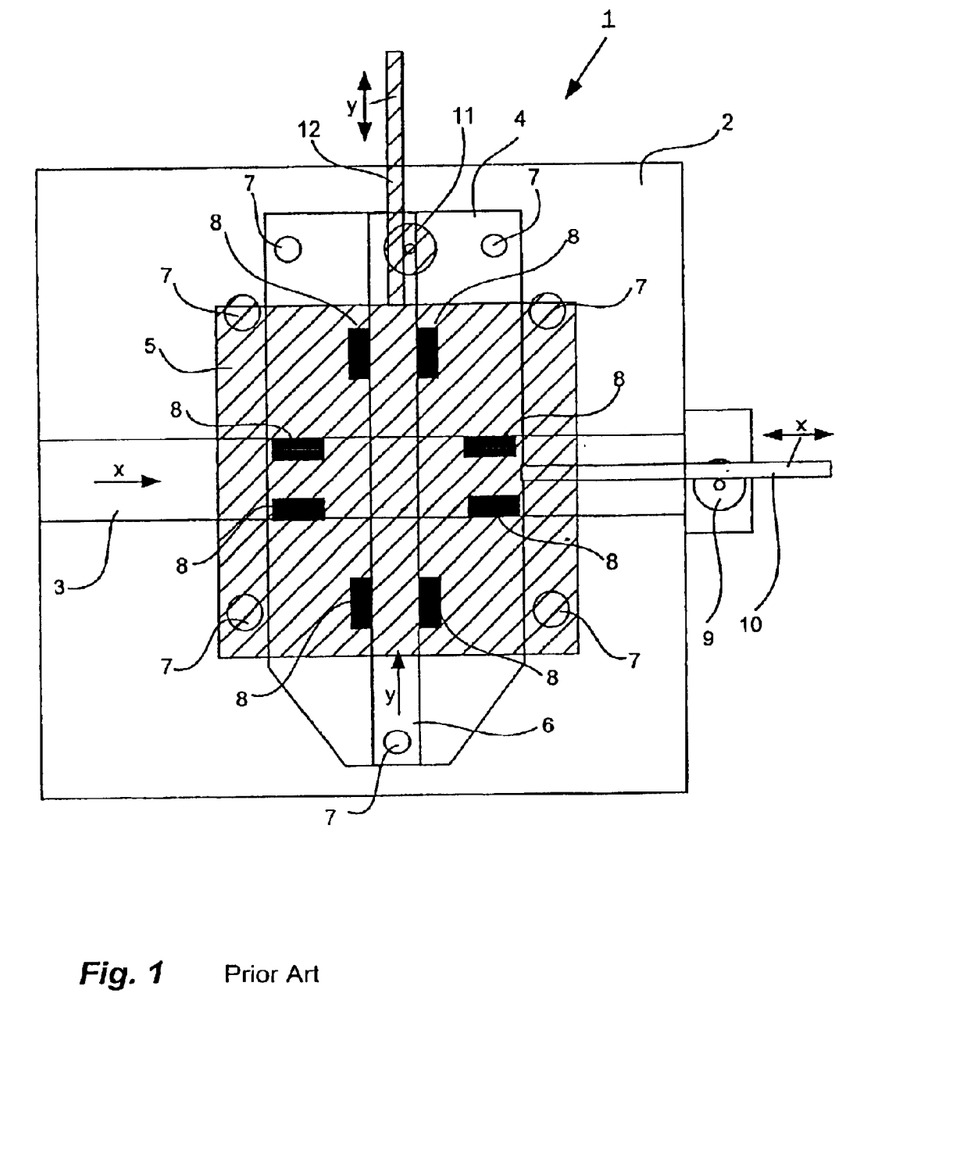
FIG. 1 is a plan view of a coordinate measuring stage according to the existing art.

FIG. 1 is a schematic plan view of coordinate measuring stage 1 known from the existing art, which is used in the known coordinate measuring instrument. An X guidance element 3, constituting a recessed groove, is arranged on a base part 2. Base part 2 itself is stationary, but possesses a plane surface that serves as the sliding surface for the moving elements of measuring stage 1. The moving parts are a center part 4 arranged above base part 2, and a stage body 4 arranged above that. Center part 4 is arranged orthogonally to X guidance element 3, and extends over most of the length of base part 2. Center part 4 carries on its upper side, arranged centeredly in the longitudinal direction, a Y guidance element 6 that is usually arranged as an emplaced rib. Center part 4 itself is movable in the X direction, since it engages with its underside, by means of guidance air bearings 8, into X guidance element 3. Mounting on base part 2 during movement is accomplished by means of three support air bearings 7.

Displacement of center part 4 along X guidance element 3 is accomplished by means of a first drive element 9. Its rotary motion is converted by means of a first pusher bar 10, which extends along X guidance element 3 configured as a groove, into a linear motion of center part 4.

At the one end of center part 4, a second drive element 11 is placed onto its upper side. Said element is co-moved as center part 4 moves. The rotary motion of second drive element 11 is converted by means of a second pusher bar 12 into a linear motion, and transferred to stage body 5 arranged above center part 4. Stage body 5 engages over center part 4 on both longitudinal sides of center part 4, and is slidingly mounted on four support air bearings 7 on the surface of the base part. Since mounting with four support surfaces is redundant, the four bearing elements are resiliently mounted. Stage body 5 is shifted by second drive element 11 in the Y direction, being guided by Y guidance element 6. Mounting with respect to Y guidance element 6 is accomplished once again by means of guidance air bearings 8.

Figure 2:
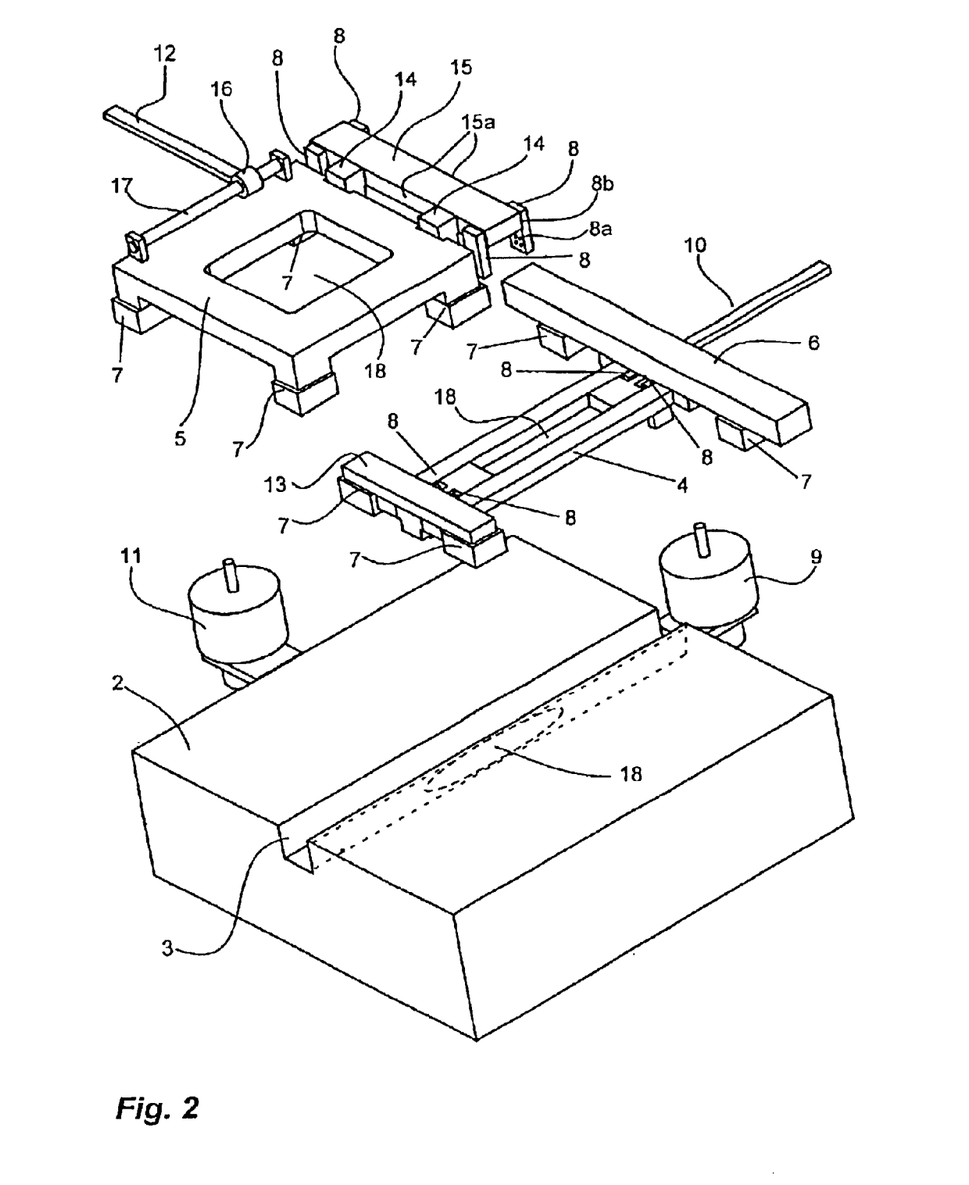
FIG. 2 is an exploded depiction of a coordinate measuring stage according to the present invention.

FIG. 2 is an exploded depiction of a coordinate measuring stage 1 according to the present invention. A base part 2, which preferably is made of a granite block, is depicted. Base part 2 is equipped with an X guidance element 3 that in this exemplary embodiment is configured as an internally located groove on the surface of base part 2. The groove comprises, as guidance surfaces, exactly parallel outer surfaces that are machined flat to μm accuracy. It would also be possible to configure the X guidance element as a raised rib on the surface of the base part. As a result, however, the entire structure of the coordinate measuring stage would be substantially higher and heavier than with a groove. Arranged above it is a center part 4 and above that, offset slightly to the side, a stage body 5.

Center part 4 is arranged in freely suspended fashion over base part 2, by being suspended from a Y guidance element 6 and an additional support element 13. Arranged on the underside of Y guidance element 6 and additional support element 13 are support air bearings 7 with which the bridge-shaped unit made up of additional support element 13, center part 4, and Y guidance element 6 is supported slidingly on base part 2. In order to achieve high tilting resistance, additional support element 13 and Y guidance element 6 were designed to be as long as possible. As a result, support air bearings 7 located therebelow could be respectively arranged with the greatest possible spacing, so that the deflection of support element 13 and Y guidance element 6 under their own weight has become minimal in each case, i.e. almost zero. Details of the construction of center part 4 are described in FIG. 3.

Arranged on freely suspended center part 4 are several guidance air bearings 8 (partially concealed here), which project downward well beyond the dimensions of center part 4 and engage into X guidance element 3 (embodied here as a groove). These guidance air bearings effect exact guidance of the X-direction motion of center part 4 along X guidance element 3. This motion is driven with a first drive element 9 that is arranged in stationary fashion on base part 2. The rotary motion of this drive element 9, which can be embodied e.g. as a stepping motor or linear motor, is transferred to center part 4 by means of a first pusher bar 10. In the Y direction, center part 4 spans only slightly more than the width of X guidance element 3, since all that is necessary is to mount guidance air bearings 8 on it for X-direction guidance. A large unobstructed displacement region, in which stage body 5 is supported on the surface of base part 2 upon displacement in the X and Y directions, exists on either side of the narrow center part 4.

Stage body 5 has two retaining elements 14 on its outer side facing toward Y guidance element 6. A Y-guide 15 is mounted on said retaining elements 14. This Y-guide 15 spans over the length and width of Y guidance element 6, and is arranged above said Y guidance element 6 when coordinate measuring stage 1 is assembled.

Y-guide 15 comprises, in the longitudinal direction on its two lateral outer surfaces, common accurately flat mounting surfaces 15a both for retaining elements 14 and for several guidance air bearings 8. At guidance air bearings 8, outlet openings 8a generate air cushions that act on the outer sides of Y guidance element 6, which functions as a guide rib. For that purpose, the outer surfaces of Y guidance element 6 and of Y-guide 15 are machined to be parallel with high accuracy.

Y-guide 15 is wider than Y guidance element 6 by an amount exactly equal to the air bearing air gaps of guidance air bearings 8 arranged on either side. Y guidance element 6 and Y-guide 15 are produced from the same material, preferably granite, to ensure identical expansion properties. Guidance air bearings 8 on Y-guide 15 thus effect precise, temperature-compensated Y-direction guidance of stage body 5.

This motion is generated by a second drive element 11 that is arranged in stationary fashion on base part 2. The rotary motion of second drive element 11 is transferred to stage body 5 by means of a second pusher bar 12. The second drive element can be embodied, for example, as a stepping motor or linear motor. Since this energy transfer by means of second pusher bar 12 must be guaranteed for all X positions of stage body 5, second pusher bar 12 acts by means of an annular air bearing 16 on a pusher bar 17 extending in the X direction, which here is of cylindrical configuration.

All the support air bearings 7 are mounted on the lapped surfaces of the undersides of center part 4 and stage body 5. The intention is thereby to prevent rotation and tilting of support air bearings 7. To obtain more latitude for guidance surface tolerances, the flying height of support air bearings 7 is designed to be approx. 5 $\mu$m. There are no resilient support air bearings 7 as in the existing art; instead, the irregularities of the granite surface are compensated for by the comparatively larger air gap. The same air gap is used on X guidance element 3 and Y guidance element 6.

The individual components of coordinate measuring stage 1 according to the present invention, for example center part 4, stage body 5, Y guidance element 6, and Y-guide 15, must comply with only one or two tolerances in terms of shape, position, and dimension. For example, Y-guide 15 requires only two high-accuracy parallel outer surfaces to receive guidance air bearings 8, and one high-accuracy dimensional tolerance for the spacing of those two outer surfaces. In the case of stage body 5, for example, all that is necessary is that its lower surfaces, on which support air bearings 7 are mounted, rest in highly accurate fashion on a lapped plane. As the second tolerance variable, the outer surface of stage body 5 on which retaining elements 14 are mounted must be at right angles, to high accuracy, to the lapped plane of the lower surfaces.

Those components of the coordinate measuring stage that could result in angular errors in the event of thermal expansion are made of material with low thermal expansion, e.g. Invar steel. These are center part 4, support element 13, and stage body 5. Thermal influences of the environment on measurement results can thereby be minimized. As already described above, the Y guidance element is made of granite, since this is necessary for the aforementioned temperature compensation in the X- and Y-direction guidance systems.

In order to allow transmitted-light measurements to be made with coordinate measuring stage 1, according to the present invention base part 2, center part 4, and stage part 5 each have an internally located opening 18. Internally located opening 18 is smallest in base part 2, and is larger on center part 4 and stage body 5 in accordance with their displacement ranges.

Figure 3:
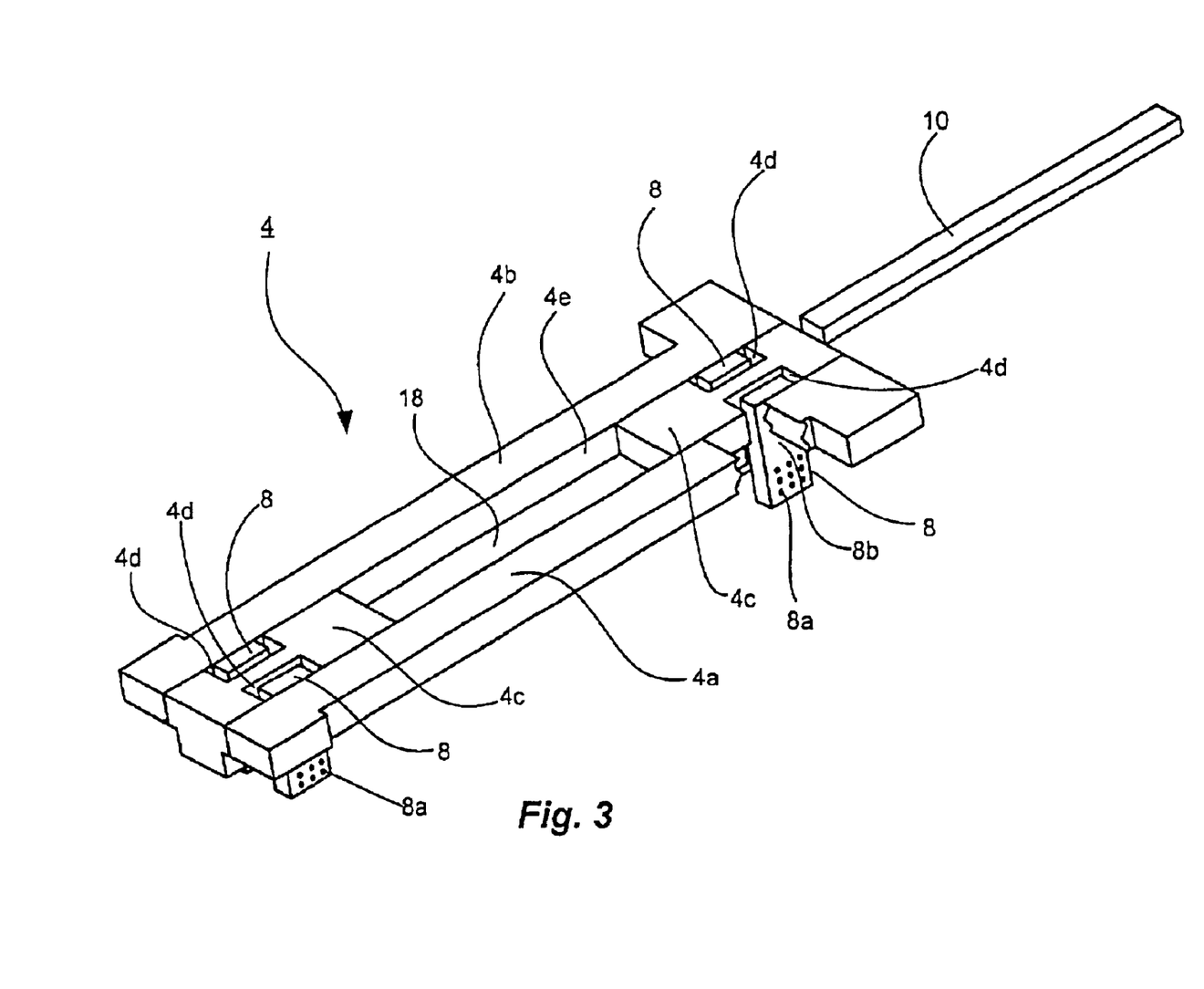
FIG. 3 is a detail view of the center part of the coordinate measuring stage.

FIG. 3 is a detail depiction of center part 4 of coordinate measuring stage 1. Center part 4 is depicted with guidance air bearings 8 arranged thereon.

The freely suspended center part 4 is depicted here without Y guidance element 6 and additional support element 13 on which it is suspended. Center part 4 comprises two center part side elements 4a, 4b that are joined to one another with at least one spacer element 4c. In the present exemplary embodiment, two spacer elements 4c are arranged between the two center part side elements 4a, 4b. Spacer elements 4c do not touch base part 2 (not depicted here) and thus are also freely suspended. Spacer elements 4c comprise cutouts 4d which constitute the open spaces for the arrangement of guidance air bearings 8. Guidance air bearings 8 are mounted with accurately flat mounting surfaces 8b on mounting surfaces 4e, provided for the purpose and also accurately flat, of center part side elements 4a, 4b, without touching the respective spacer element 4c located alongside.

In order to illustrate the arrangement of guidance air bearings 8, center part side element 4a on one of guidance air bearings 8 is depicted in the opened state. It is evident that guidance air bearing 8 is arranged in an internally located cutout 4d of spacer element 4c, and projects downward well beyond the lower dimension of center part 4. The outlet openings 8a of the actual air bearing are arranged on the outer side of the downwardly projecting portion of guidance air bearing 8.

With this downwardly projecting portion of guidance air bearing 8 and of all guidance air bearings 8, these guidance air bearings engage into X guidance element 3 (not depicted here), configured as a groove, of base part 2 (not depicted here). Outlet openings 8a face toward the inner sides of the groove, in which form X guidance element 3 is embodied. To complete the depiction, first pusher bar 10 is also depicted.

Center part 4 is a constituent of a coordinate measuring stage 1 for a high-precision coordinate measuring instrument which (as already stated) is operated at different ambient temperatures. The entire guidance system should therefore be temperature-compensated in both the X and Y directions. This was achieved here by the fact that spacer elements 4c are made from granite, and therefore exhibit the same expansion coefficients as X guidance element 3, which is also made of granite. Spacer elements 4c are narrower than the internal width of the groove, i.e. of X guidance element 3, by an amount equal to the two air gaps. The width of spacer elements 4c thus predefines the width of the air gaps of guidance air bearings 8. The fact that the temperature-related expansion of spacer elements 4c is always identical to that of the groove ensures that the width of the air gaps of guidance air bearings 8 always remains unchanged. The accuracy of the guidance system in the X direction is thus independent of ambient temperature.

Figure 4:
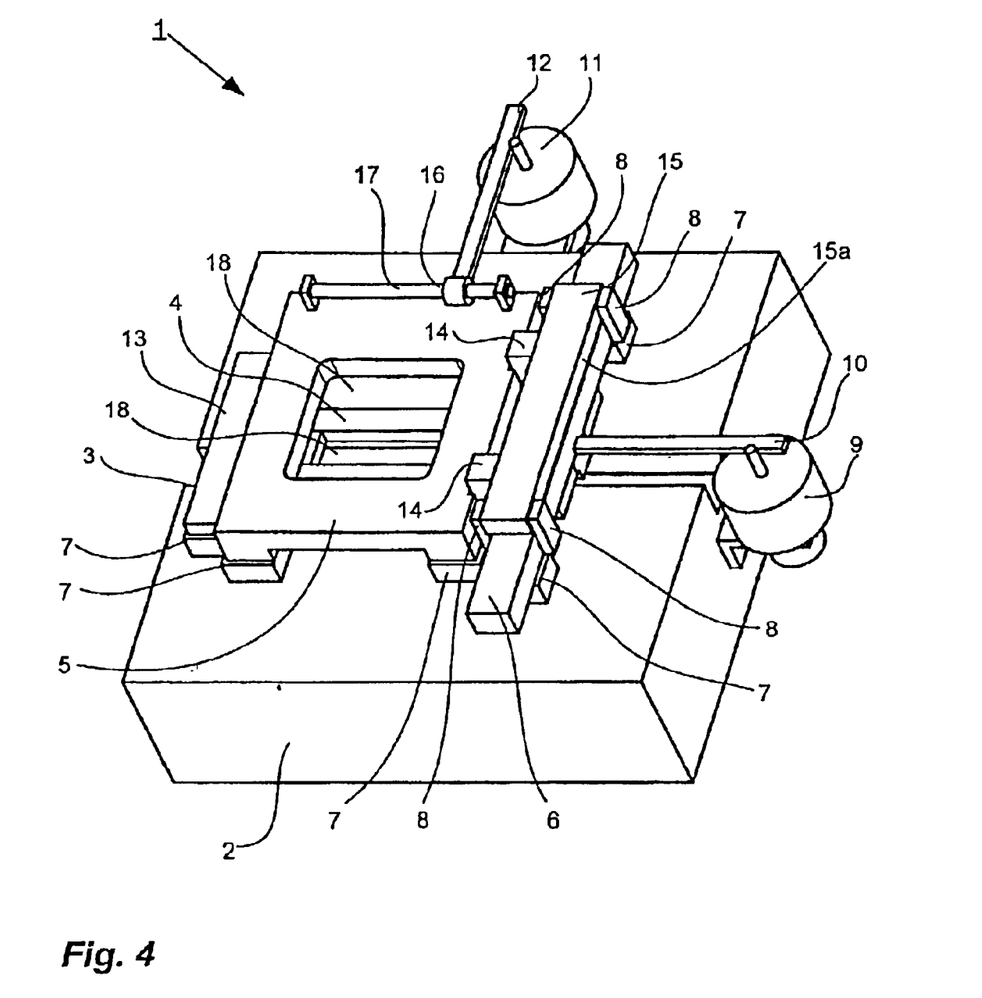
FIG. 4 is a perspective view of a coordinate measuring stage according to the present invention.

FIG. 4 is a perspective view of a completely assembled coordinate measuring stage 1 according to the present invention. A base part 2 is depicted, with a center part 4 arranged above it. Center part 4 is suspended on a Y guidance element 6 and an additional support element 13, both of which are supported by means of support air bearings 7 on the plane surface of base part 2 and are slidingly displaceable thereon. For displacement of center part 4 in the X direction, base part 2 comprises an X guidance element 3 embodied as a groove. Guidance air bearings 8 arranged on center part 4, which engage into X guidance element 3 in order to guide the motion in the X direction, are concealed in this depiction. In order to implement the X-direction motion, center part 4 is joined to a first pusher bar 10 that transfers the rotary motion of a first drive element 9 to center part 4.

Stage body 5, which spans far beyond center part 4, is arranged over center part 4. Stage body 5 is also supported on the surface of base part 2 by means of several support air bearings 7, and is displaceable slidingly in the Y direction along a Y guidance element 6. Since this Y guidance element 6 carries center part 4 that is movable in the X direction, stage body 5 constrainedly follows every movement of center part 4 in the X direction.

Two retaining elements 14, on which a Y-guide 15 is mounted, are arranged on the outer side of stage body 5 facing toward Y guidance element 6. Arranged externally on Y-guide 15 are several guidance air bearings 8, which are mounted against the outer side of Y guidance element 6 and ensure precise motion of stage body 5 along Y guidance element 6. To achieve the Y-direction motion, a second drive element 11, whose rotary motion is transferred to stage body 5 with a second pusher bar 12, is arranged in stationary fashion on base part 2. For that purpose, second pusher bar 12 engages at its one end, with an annular air bearing 16, on a pusher bar 17 extending in the X direction.

Base part 2, center part 4, and stage body 5 each comprise, superimposed on one another, an internally located opening 18 which delimits a transmitted-light region for transmitted-light measurements.

Figure 5:
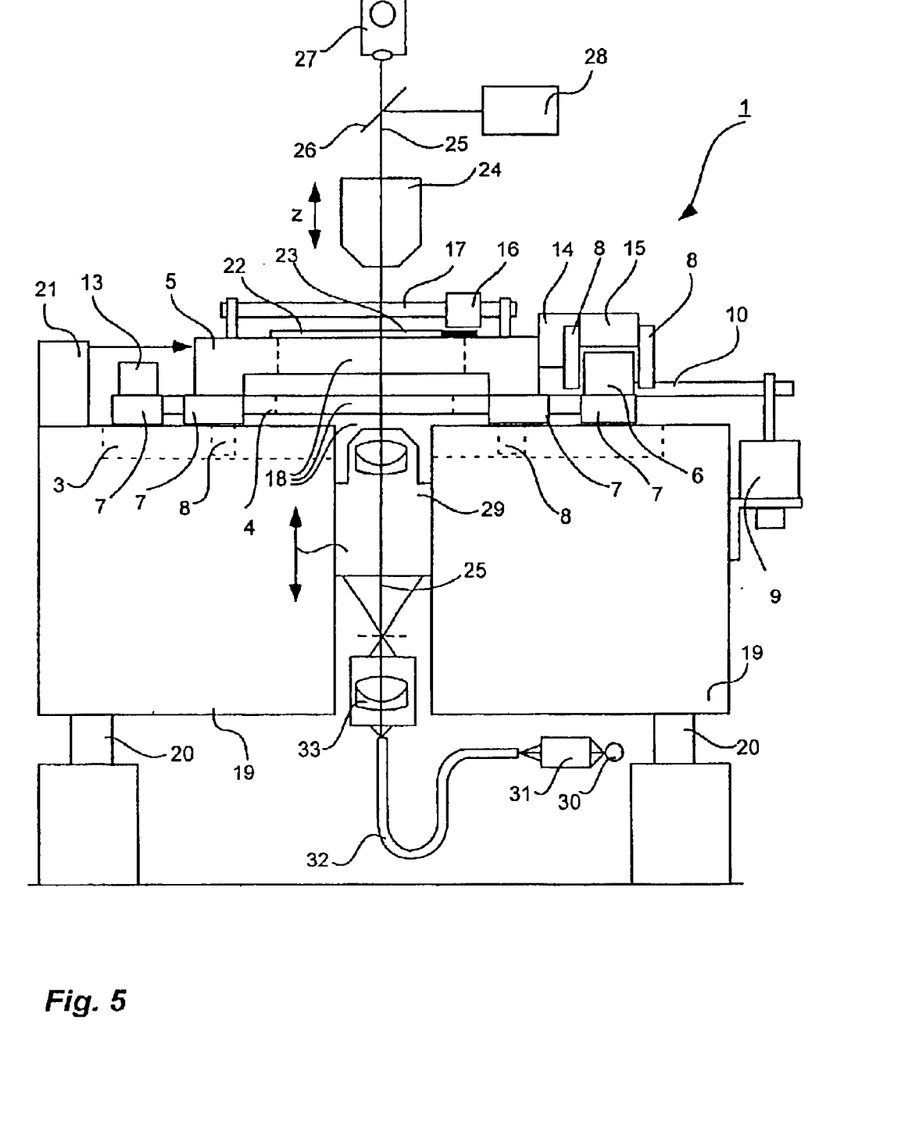
FIG. 5 is a coordinate measuring instrument according to the present invention.

FIG. 5 shows an exemplary embodiment of a coordinate measuring instrument according to the present invention, having a combined incident-light and transmitted-light illumination system.

The coordinate measuring instrument that is depicted comprises a granite block 19 that is mounted on vibration dampers 20 and constitutes the base part (corresponding to base part 2 of FIGS. 2 through 4) of a coordinate measuring stage 1. For that purpose, granite block 19 has on its upper side, as X guidance element 3, a recessed groove (depicted with dashed lines) in the X direction and an internally located opening 18.

Arranged in freely suspended fashion over granite block 19 is a center part 4 of coordinate measuring stage 1 that comprises an internally located opening 18. Center part 4 is suspended on a Y guidance element 6 and an additional support element 13. Y guidance element 6 and additional support element 13 are slidingly displaceable on the surface of highly accurately flat granite block 19 by means of support air bearings 7. To ensure secure guidance of center part 4 in the X direction, several guidance air bearings 8 (depicted with dashed lines), which engage into X guidance element 3 (i.e. the groove) and slide with the air cushions of guidance air bearings 8 along the outer sides of said groove, are mounted on center part 4. Center part 4 is displaced by means of a drive element (not depicted).

Arranged over center part 4 is a stage body 5 also configured with an internally located opening 18. It is slidingly displaceable on the surface of granite block 19 on support air bearings 7. Stage body 5 is displaced in the Y direction by means of a drive element (not depicted). To ensure secure guidance in the Y direction, stage body 5 is guided along Y guidance element 6. Retaining elements 14, on which a Y-guide 15 is mounted above Y guidance element 6, are immovably joined for that purpose to stage body 5. Said Y-guide 15 spans over Y guidance element 6 and comprises several guidance air bearings 8 on its outer sides. Guidance air bearings 8 slide with their air cushions along the outer sides of Y guidance element 6, thus ensuring exact guidance in the Y direction.

In the X direction, stage body 5 constrainedly follows the motion of center part 4 in the X direction. In this fashion, stage body 5 can assume any desired position in the X and Y directions. The position of stage body 5 in the X and the Y direction is measured with one laser interferometer system 21 in each case (only one depicted).

A mask 22 is placed onto stage body 5. Mask 22 is made, for example, of quartz glass. Features 23 are applied on the mask surface. Since granite block 19 (i.e. the base part), center part 4, and stage body 5 are embodied as frames, mask 22 can also be transilluminated from below through internally located openings 18.

An objective 24 of high optical quality, which is adjustable in the Z direction along its optical axis 25 for focusing, is located above mask 22 as the imaging system. By way of a splitter mirror 26, on the one hand the light of an incident light source 27 is introduced into the optical beam path, and on the other hand the imaging beams are directed onto a detector device 28. Detector device 28 is, for example, a CCD camera having a high-resolution pixel array, or another spatially resolving detector. Incident light source 27 emits, for example, in the near UV spectral region. By means of detector device 28, the position of a feature 23 is determined as coordinates on mask 22. Determination of the coordinates is usually accomplished relative to a reference point.

Within and below granite block 19, a transmitted-light illumination device having an adjustable-height condenser 29 and a transmitted light source 30 is used as a further illumination device. A transmitted-light illumination beam path having an optical axis 25 proceeds from transmitted light source 30. The light of transmitted light source 30 is accepted via an magnifying incoupling optical system 31 having the largest possible numerical entrance aperture (e.g. NA=0.60). The accepted light is coupled by way of incoupling optical system 31 into an optical waveguide 32. An outcoupling optical system 33, which is preferably embodied as an achromat, collimates the light emitted from optical waveguide 32.

The optical axis of condenser 29 aligns with optical axis 25 of objective 24. Vertical adjustment of condenser 29 serves to adapt the illuminating beams to be directed onto feature 23 to masks 22 having different optical thicknesses. The condenser head can in particular, as depicted here, extend into the internally located opening of the measuring stage frame. When X-Y displacements of stage body 5 occur over the entire mask surface, however, condenser 29 can also be pulled below the surface of granite block 19 for protection from damage. Light sources 30 and 27 can be switched on independently of one another, thereby making possible, individually or alternatingly, measurement with incident-light illumination and transmitted-light illumination.

The present invention has been described with reference to exemplary embodiments. It is nevertheless apparent to anyone skilled in this art that changes and modifications can be made without thereby leaving the range of protection of the claims below.

Parts List

1 Coordinate measuring stage
2 Base part
3 X guidance element
4 Center part
4a,b Center part side elements
4c Spacer element
4d Cutouts
4e Mounting surface for guidance air bearings
5 Stage body
6 Y guidance element
7 Support air bearing 8 Guidance air bearing
8a Outlet openings
8b Mounting surface on guidance air bearing
9 First drive element
10 First pusher bar
11 Second drive element
12 Second pusher bar
13 Additional support element
14 Retaining elements
15 Y-guide
15a Mounting surfaces
16 Annular air bearing
17 Pusher bar
18 Internally located opening
19 Granite block
20 Vibration dampers
21 Laser interferometer system
22 Mask
23 Features
24 Objective
25 Optical axis
26 Splitter mirror
27 Incident light source
28 Detector device
29 Condenser
30 Transmitted light source
31 Incoupling optical system
32 Optical waveguide
33 Outcoupling optical system

What is claimed is:

1. A coordinate measuring stage (1) with interferometric position determination, comprising:

a stationary base part (2) having a linear X guidance element (3);

a center part (4) placed above said stationary base part (2), wherein said center part (4) is movable slidingly along the linear X guidance element (3), which has a first drive element (9) associated with it and is rigidly joined to a linear Y guidance element (6);

an X-Y-positionable stage body (5) placed above said center part (4), wherein said X-Y-positionable stage body (5), which is assigned for reception of a substrate, is movable slidingly along the Y guidance element (6) and has a second drive element (11) associated with it;

said center part (4) is arranged in freely suspended fashion over said base part (2), being supported with its one end on said Y guidance element (6) and with its other end on an additionally arranged support element (13);

said Y guidance element (6), said support element (13), and said stage body (5) are supported, slidably and independently of one another, on the surface of said base part (2); and said base part (2), said center part (4), and said stage body (5) each comprise an internally located opening (18) for a transmitted-light region.

2. The coordinate measuring stage (1) as defined in claim 1, wherein said first drive element and said second drive element are arranged in stationary fashion relative to the base part (2).

3. The coordinate measuring stage (1) as defined in claim 1, wherein several support air bearings (7) are arranged under said stage body (5), said Y guidance element (6), and said support element (13) and support them on said base part (2).

4. The coordinate measuring stage (1) as defined in claim 1, wherein said X guidance element (3) is embodied as an internally located groove in said base part (2) or as a raised rib on said base part (2).

5. The coordinate measuring stage (1) as defined in claim 4, wherein said center part (4) comprises two lateral center part side elements (4a, 4b) and at least one spacer element (4c) arranged between said two center part side elements (4a, 4b).

6. The coordinate measuring stage (1) as defined in claim 5, wherein several guidance air bearings (8), which are mounted against the X guidance element (3) and guide the X-direction motion of the center part (4), are arranged on said center part side elements (4a, 4b).

7. The coordinate measuring stage (1) as defined in claim 6, wherein said guidance air bearings (8) comprise accurately flat mounting surfaces (8b) and are mounted with the latter on mounting surfaces (4e), provided for the purpose and also accurately flat, of said center part side elements (4a, 4b), the width of the air gaps of said guidance air bearings (8) being unchangeably predefined by the difference between the width of said X guidance element (3) and the width of said spacer element (4c).

8. The coordinate measuring stage (1) as defined in one of claims 6 or 7, wherein the base part (2) and the spacer element (4c) have substantially the same expansion coefficients.

9. The coordinate measuring stage (1) as defined in claim 8, wherein said base part (2) and said spacer element (4c) are made of the same material.

10. The coordinate measuring stage (1) as defined in claim 1, wherein a Y-guide (15) is arranged on the stage body (5); and several guidance air bearings (8), which are mounted against said Y guidance element (6) and guide the Y-direction motion of said stage body (5), are mounted on said Y-guide (15).

11. The coordinate measuring stage (1) as defined in claim 10, wherein said guidance air bearings (8) comprise accurately flat mounting surfaces (8b) and are mounted with the latter on mounting surfaces (15a), provided for the purpose and also accurately flat, of said Y-guide (15), the width of the air gaps of the guidance air bearings (8) being unchangeably predefined by the difference between the width of said Y guidance element (3) and the width of said Y-guide (15).

12. The coordinate measuring stage (1) as defined in claim 10 or 11, wherein a) said linear Y guidance element (6) comprises an internally located guidance groove; and b) at least one retaining element (14), on which are arranged several guidance air bearings (8) that engage against the inner surfaces of the guidance groove and guide the Y-direction motion of said stage body (5), is arranged on said stage body (5) for retention of said Y-guide (15).

13. The coordinate measuring stage (1) as defined in claim 10 or 11, wherein a) said linear Y guidance element (6) is embodied as a rib; and b) at least one retaining element (14), on which are arranged several guidance air bearings (8) that engage externally against said rib and guide the Y-direction motion of said stage body (5), is arranged on said stage body (5) for retention of said Y-guide (15).

14. The coordinate measuring stage (1) as defined in claim 11, wherein said Y-guide (15) and said Y guidance element (6) have substantially the same expansion coefficients.

15. The coordinate measuring stage (1) as defined in claim 13, wherein said Y-guide (15) and said Y guidance element (6) are made of the same material.

16. A coordinate measuring instrument for high-accuracy measurement of the coordinates of an edge of a pattern element (23) on a substrate (22), comprising:

an X-Y displaceable coordinate measuring stage (1) with interferometric position determination, which comprises a stationary base part (2) having a linear X guidance element (3); above that, a center part (4) movable slidingly along the linear X guidance element (3); and above that, an X-Y-positionable stage body (5), for reception of the substrate, which is movable slidingly along the Y guidance element (6);

and an illumination device having an optical axis (25), an imaging device (24), and a detector device (28) for determining the coordinates of said edge to be measured relative to said optical axis (25) of said illumination device;

said center part (4) is arranged in freely suspended fashion over said base part (2), being supported with its one end on said Y guidance element (6) and with its other end on an additionally arranged support element (13);

said Y guidance element (6), said support element (13), and said stage body (5) are supported, slidably and independently of one another, on the surface of said base part (2); and said base part (2), said center part (4), and said stage body (5) of said measuring stage each comprise an internally located opening (18) for a transmitted-light region, and said illumination device is provided for incident-light and transmitted-light illumination of the substrate (22).

17. The coordinate measuring instrument as defined in claim 16, wherein a first drive element (9) is associated with said center part (4) of said measuring stage, and a second drive element (11) with said stage body (5) of said measuring stage; and the first drive element and second drive element are arranged in stationary fashion relative to said base part (2) of said measuring stage.

18. The coordinate measuring stage (1) as defined in claim 10, wherein a) said linear Y guidance element (6) is embodied as a rib;

b) at least one retaining element (14), on which are arranged several guidance air bearings (8) that engage externally against said rib and guide the Y-direction motion of said stage body (5), is arranged on said stage body (5) for retention of said Y-guide (15); and c) said Y-guide (15) and said Y guidance element (6) have substantially the same expansion coefficients.

* * * * *